(12) United States Patent
Park et al.

(10) Patent No.: US 12,381,169 B2
(45) Date of Patent: Aug. 5, 2025

(54) SEMICONDUCTOR PACKAGE

(71) Applicant: Samsung Electronics Co., Ltd., Suwon-si (KR)

(72) Inventors: Soojeoung Park, Hwaseong-si (KR); Heeseok Lee, Suwon-si (KR); Hei Seung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/584,469

(22) Filed: Feb. 22, 2024

(65) Prior Publication Data

US 2024/0194626 A1 Jun. 13, 2024

Related U.S. Application Data

(62) Division of application No. 17/036,144, filed on Sep. 29, 2020, now abandoned.

(30) Foreign Application Priority Data

Feb. 19, 2020 (KR) .......................... 10-2020-0020634

(51) Int. Cl.
*H01L 23/00* (2006.01)
*H01L 23/31* (2006.01)
*H01L 23/538* (2006.01)

(52) U.S. Cl.
CPC .............. *H01L 24/09* (2013.01); *H01L 24/05* (2013.01); *H01L 24/08* (2013.01); *H01L 24/16* (2013.01);
(Continued)

(58) Field of Classification Search
CPC ............... H01L 25/0657; H01L 25/074; H01L 21/8221; H01L 2224/023–024; H01L 2224/0235; H01L 2224/02372; H01L 2224/02373; H01L 23/49822; H01L 23/5383; H01L 23/49827; H01L 23/5384; H01L 23/481; H01L 29/4175;
(Continued)

(56) References Cited

U.S. PATENT DOCUMENTS 8,133,762 B2 3/2012 Pagaila et al.
8,193,034 B2 6/2012 Pagaila et al.
(Continued)

FOREIGN PATENT DOCUMENTS

JP 5536707 B2 7/2014

*Primary Examiner* — Wael M Fahmy
*Assistant Examiner* — Quinton A Brasfield
(74) *Attorney, Agent, or Firm* — Muir Patent Law, PLLC

(57) ABSTRACT

A semiconductor package includes a redistribution layer and a semiconductor chip provided on the redistribution layer having a first surface and a second surface opposite to the first surface. The semiconductor chip includes a first chip pad and a second chip pad which are exposed at the first surface. The semiconductor package further includes a capacitor chip disposed between the first surface and the redistribution layer and including a capacitor chip pad connected to the first chip pad, an insulating layer covering the first surface and the capacitor chip, and a conductive post being in contact with the second chip pad and penetrating the insulating layer so as to be connected to the redistribution layer. The conductive post may be spaced apart from the capacitor chip.

13 Claims, 17 Drawing Sheets

(52) U.S. Cl.
CPC .......... *H01L 24/73* (2013.01); *H01L 23/3128* (2013.01); *H01L 23/5389* (2013.01); *H01L 2224/02313* (2013.01); *H01L 2224/02333* (2013.01); *H01L 2224/02381* (2013.01); *H01L 2224/05569* (2013.01); *H01L 2224/08112* (2013.01); *H01L 2224/08225* (2013.01); *H01L 2224/08265* (2013.01); *H01L 2224/0903* (2013.01); *H01L 2224/09103* (2013.01); *H01L 2224/16112* (2013.01); *H01L 2224/16227* (2013.01); *H01L 2224/16265* (2013.01); *H01L 2224/73204* (2013.01); *H01L 2924/19041* (2013.01); *H01L 2924/19103* (2013.01)

(58) Field of Classification Search
CPC .................. H01L 2225/06541–06544; H01L 2225/06548; H01L 21/76898; H01L 21/486
See application file for complete search history.

(56) References Cited

U.S. PATENT DOCUMENTS

| | | | |
|---|---|---|---|
| 8,482,134 B1 * | 7/2013 | Darveaux | H01L 25/50 |
| | | | 257/E23.021 |
| 9,412,689 B2 * | 8/2016 | Lin | H01L 21/56 |
| 9,704,796 B1 | 7/2017 | Gu et al. | |
| 10,056,327 B2 | 8/2018 | Zhai et al. | |
| 10,381,302 B2 | 8/2019 | Shih et al. | |
| 2002/0085336 A1 * | 7/2002 | Winer | H01L 23/49822 |
| | | | 361/306.3 |
| 2015/0382469 A1 | 12/2015 | Hu et al. | |
| 2016/0093592 A1 | 3/2016 | Zhai | |
| 2017/0062398 A1 | 3/2017 | Arabi et al. | |
| 2018/0145036 A1 * | 5/2018 | Kim | H01L 23/3128 |
| 2018/0294255 A1 | 10/2018 | Liu | |
| 2019/0013301 A1 | 1/2019 | Cheah et al. | |
| 2019/0074347 A1 | 3/2019 | Funaki et al. | |
| 2019/0057949 A1 | 4/2019 | Hwang et al. | |
| 2019/0139911 A1 | 5/2019 | Gutierrez et al. | |
| 2019/0148276 A1 * | 5/2019 | Chen | H01L 21/563 |
| | | | 257/774 |
| 2019/0148330 A1 | 12/2019 | Chen et al. | |
| 2020/0343223 A1 | 12/2020 | Chen et al. | |
| 2021/0091005 A1 | 3/2021 | Tsai et al. | |
| 2021/0193578 A1 * | 6/2021 | Fang | H01L 21/56 |

* cited by examiner

SEMICONDUCTOR PACKAGE

CROSS-REFERENCE TO RELATED APPLICATION

This U.S. non-provisional patent application is a divisional of and claims priority to U.S. patent application Ser. No. 17/036,413 filed on Sep. 29, 2020, which claims priority under 35 U.S.C. § 119 to Korean Patent Application No. 10-2020-0020634, filed on Feb. 19, 2020, in the Korean Intellectual Property Office, the disclosures of which are hereby incorporated by reference in its their entirety.

BACKGROUND

Embodiments of the inventive concepts relate to a semiconductor package and, more particularly, to a semiconductor package including a capacitor.

An integrated circuit chip may be realized in the form of a semiconductor package so as to be appropriately applied to an electronic product. In a typical semiconductor package, a semiconductor chip may be mounted on a printed circuit board (PCB) and may be electrically connected to the PCB through bonding wires or bumps. Various researches for improving reliability and durability of semiconductor packages have been conducted with the development of an electronic industry.

SUMMARY

Embodiments of the inventive concepts may provide a semiconductor package with improved reliability and operating speed and a method of manufacturing the same.

In an aspect, a semiconductor package may include a redistribution layer, a semiconductor chip provided on the redistribution layer and having a first surface and a second surface opposite to the first surface, the semiconductor chip including a first chip pad and a second chip pad which are exposed at the first surface, a capacitor chip disposed between the first surface and the redistribution layer and including a capacitor chip pad connected to the first chip pad, an insulating layer covering the first surface and the capacitor chip, and a conductive post being in contact with the second chip pad and penetrating the insulating layer so as to be connected to the redistribution layer. The conductive post may be spaced apart from the capacitor chip.

In an aspect, a semiconductor package may include a redistribution layer, a first semiconductor chip provided on the redistribution layer and having a first surface and a second surface opposite to the first surface, the first semiconductor chip including a first chip pad and a second chip pad which are exposed at the first surface, a capacitor chip covering the first surface and disposed between the first surface and the redistribution layer, the capacitor chip including a capacitor chip pad connected to the first chip pad, and a through-structure penetrating the capacitor chip and connecting the second chip pad to the redistribution layer. A sidewall of the capacitor chip may be vertically aligned with a sidewall of the first semiconductor chip.

In an aspect, a semiconductor package may include a redistribution layer comprising redistribution patterns and insulating patterns, a semiconductor chip provided on the redistribution layer and having a first surface and a second surface opposite to the first surface, the semiconductor chip including first chip pads and a second chip pad which are exposed at the first surface, a plurality of capacitor chips disposed between the first surface and the redistribution layer and including capacitor chip pads connected to the first chip pads, an insulating layer covering the first surface and the capacitor chips, a conductive post being in contact with the second chip pad and penetrating the insulating layer so as to be connected to the redistribution layer, the conductive post spaced apart from the capacitor chips, a molding pattern provided on the redistribution layer and covering the semiconductor chip, a first connection pad provided on the redistribution layer, and a second connection pad provided on a bottom surface of the insulating layer, a connection portion disposed between the first connection pad and the second connection pad, a connection substrate provided on the redistribution layer and having a hole penetrating the connection substrate, wherein the semiconductor chip and the capacitor chips are provided in the hole, and an upper redistribution pattern provided on a top surface of the molding pattern.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
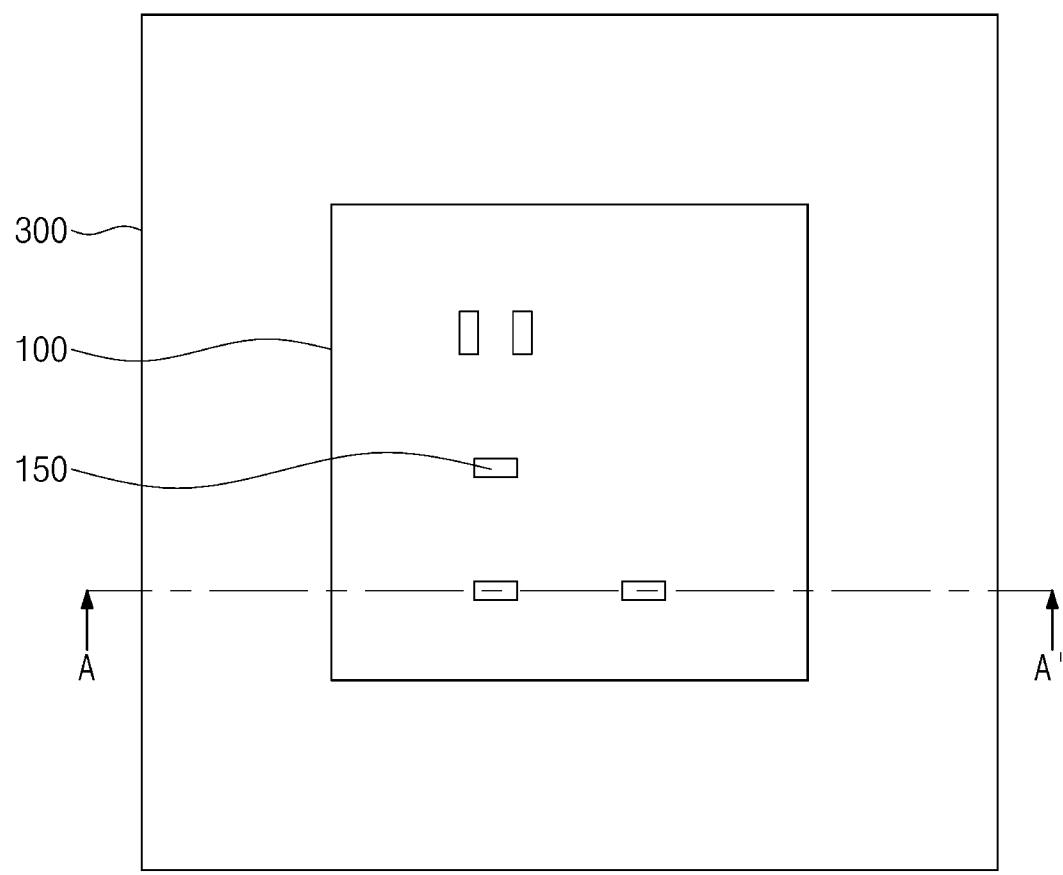
FIG. 1 is a plan view illustrating a semiconductor package according to some embodiments of the inventive concepts.

The same reference numerals or the same reference designators may denote the same elements or components throughout the specification.

A semiconductor package and a method of manufacturing the same according to embodiments of the inventive concepts will be described hereinafter.

Figure 2A:
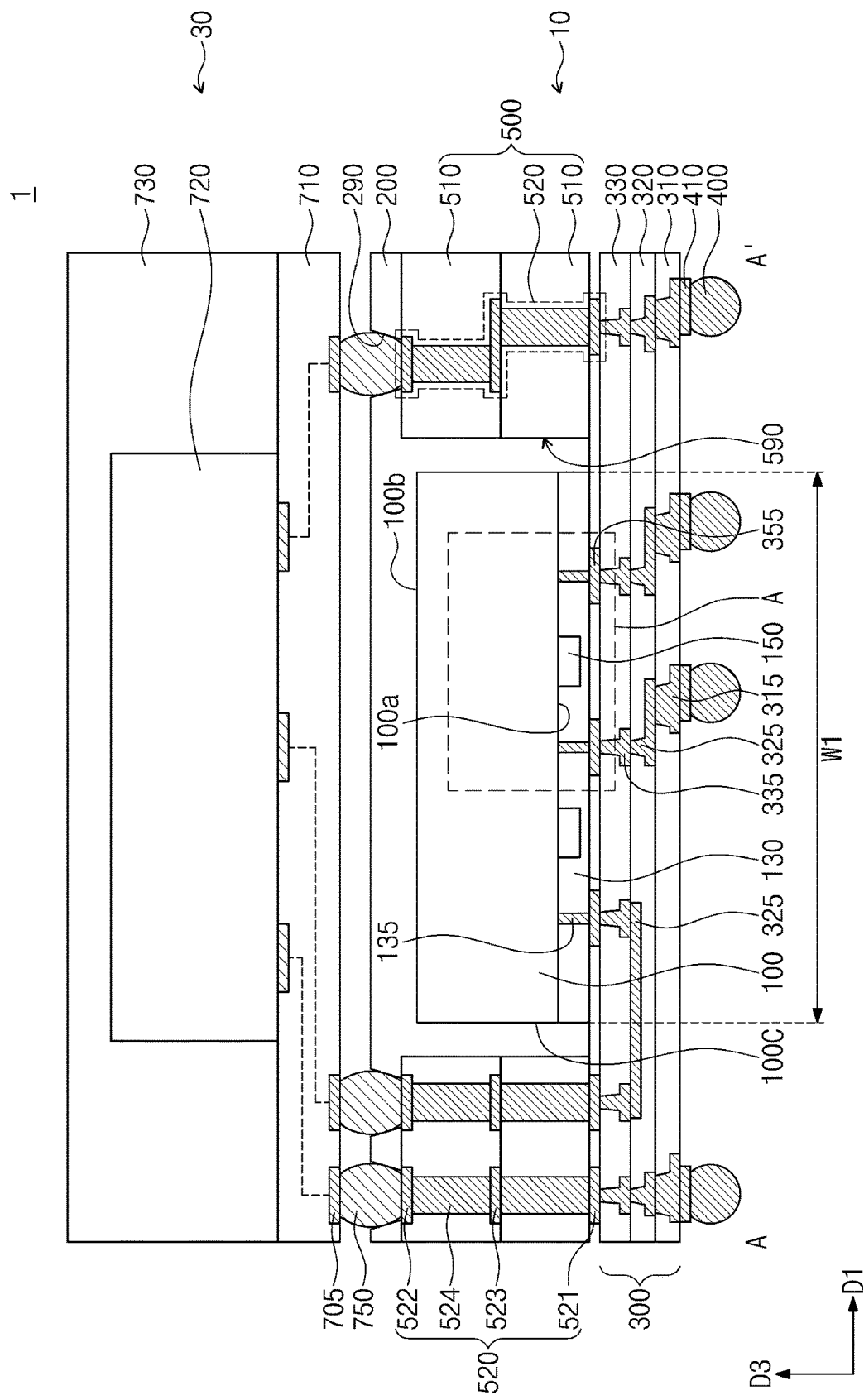
FIGS. 2A and 2B are cross-sectional views taken along a line A-A' of FIG. 1.
Figure 3A:
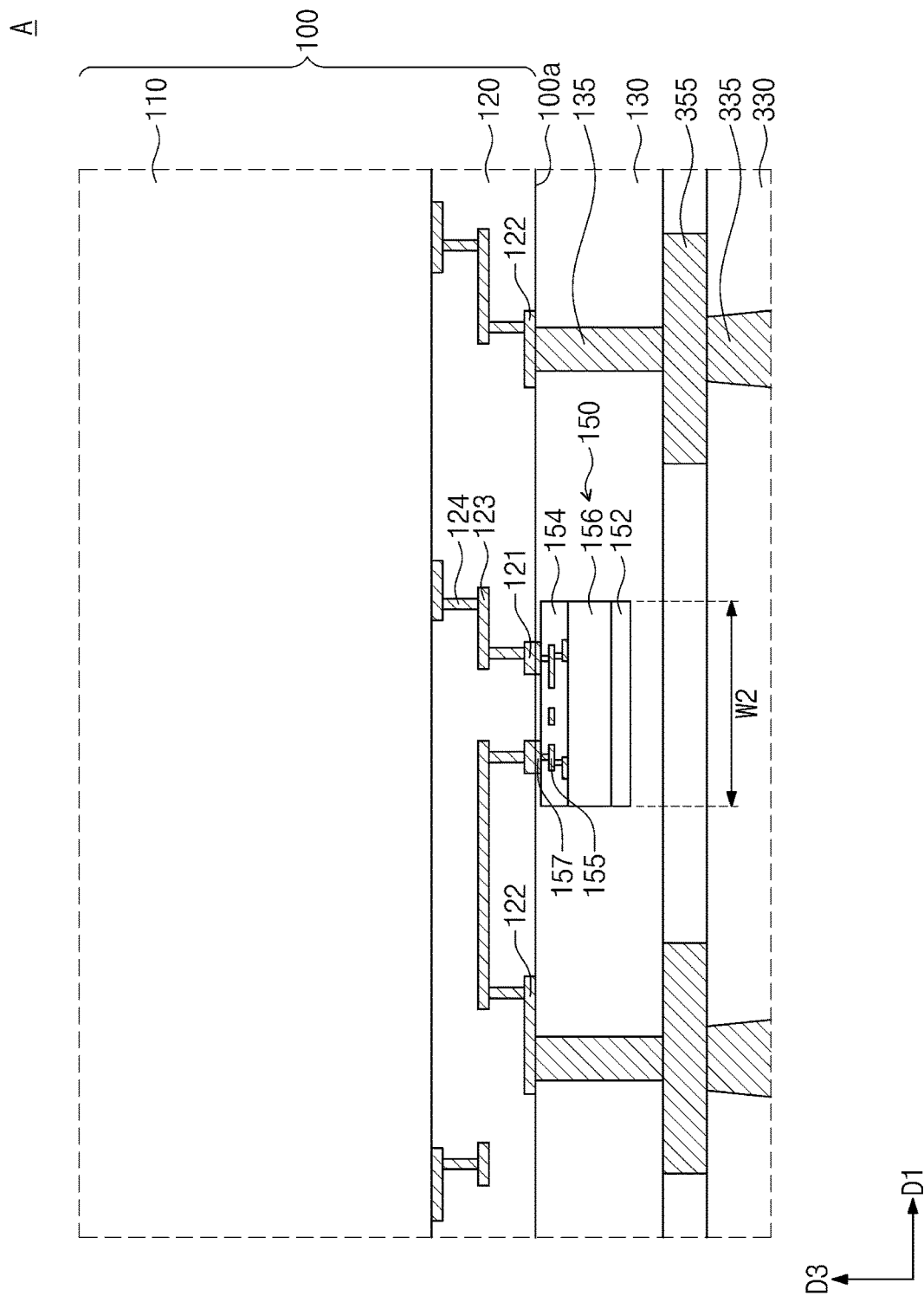
FIGS. 3A and 3B are enlarged views of a region 'A' of each of FIGS. 2A and 2B.
Figure 3B:
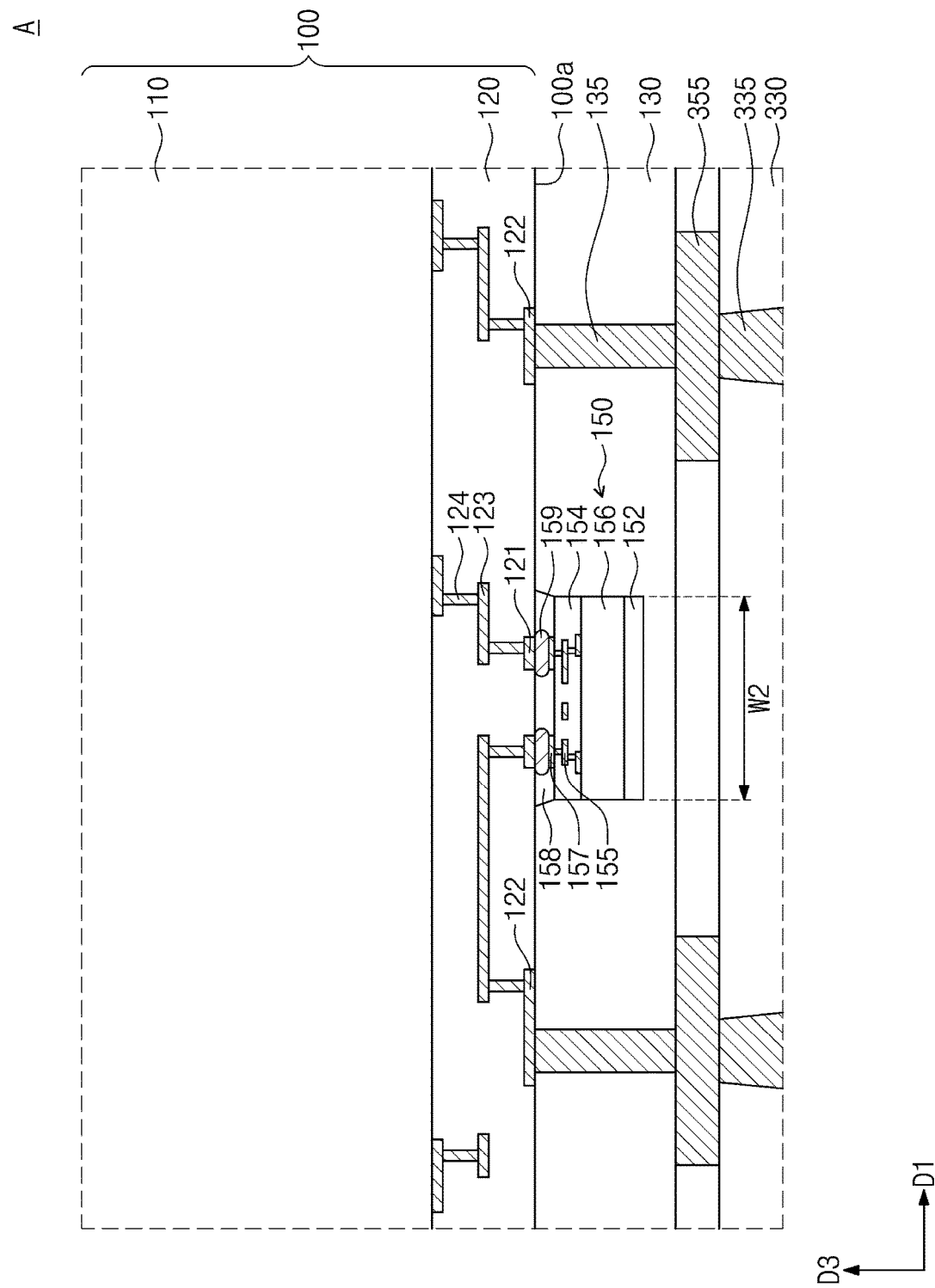

FIG. 1 is a plan view illustrating a semiconductor package according to some embodiments of the inventive concepts. FIG. 2A is a cross-sectional view taken along a line A-A' of FIG. 1. FIGS. 3A and 3B are enlarged views of a region 'A' of FIG. 2A.

Referring to FIGS. 1, 2A, 3A and 3B, a semiconductor package 1 may include a first semiconductor package 10 and a second semiconductor package 30. The first semiconductor package 10 may include a first semiconductor chip 100, a capacitor chip 150, and a redistribution layer 300. The second semiconductor package 30 may include a package substrate 710, a second semiconductor chip 720, and an upper molding pattern 730. A connection terminal 750 may be disposed between the first semiconductor package 10 and the second semiconductor package 30. The connection terminal 750 may connect the first semiconductor package 10 and the second semiconductor package 30 to each other. Hereinafter, the first semiconductor package 10 will be described in more detail.

The first semiconductor chip 100 may include a first base layer 110 and a first interconnection layer 120. The first semiconductor chip 100 may be a system-on-chip (SOC), a logic chip, or an application processor (AP). The first semiconductor chip 100 may include circuits having different functions from each other. The first semiconductor chip 100 may include at least two of a logic circuit, a memory circuit, a digital integrated circuit (IC), a radio-frequency integrated circuit (RFIC), or an input/output (I/O) circuit. As illustrated in FIG. 3A, the first interconnection layer 120 may include internal interconnection lines 123, first chip pads 121, second chip pads 122, and vias 124. The first interconnection layer 120 may include a plurality of layers. For example, the first interconnection layer 120 may be formed of a plurality of conductive layers separated from each other by corresponding insulating layers disposed therebetween. The conductive layers may be patterned and various conductive pattern elements of the conductive layers may be interconnected by vias 124. The first interconnection layer may thus form a plurality of discrete wirings (e.g., discrete conductive paths formed from one or more conductive pattern element(s) of the patterned conductive layers) to interconnect chip pads 122 to internal circuitry of the first semiconductor chip 100. In addition, such discrete wiring may interconnect chip pads 122 to respective second chip pads 122 as shown in FIG. 3A. The first semiconductor chip 100 may have a first surface 100a and a second surface 100b opposite to the first surface 100a. The first surface 100a may face the redistribution layer 300. The second surface 100b may be a non-active surface. The first chip pad 121 and the second chip pad 122 may be exposed at the first surface 100a.

The capacitor chip 150 may be provided on the first surface 100a of the first semiconductor chip 100. For example, the capacitor chip 150 may be an integrated stacked capacitor (ISC) chip. The capacitor chip 150 may include a base substrate 152, a capacitor layer 156, and a second interconnection layer 154. For example, the base substrate 152 may be a substrate including silicon, germanium, or silicon-germanium. The capacitor layer 156 may be disposed between the base substrate 152 and the second interconnection layer 154 and form one or more capacitors of the capacitor chip 150 to which the first semiconductor chip 100 is electrically connected through first chip pads 121 and capacitor chip pads 157 (e.g., as described herein). The capacitor layer 156 may include a plurality of trenches having a high aspect ratio. A plurality of coating layers may be deposited in the plurality of trenches. The coating layers may include, for example, titanium nitride (TiN). The second interconnection layer 154 may include circuit patterns 155 therein. A capacitor chip pad 157 connected to the circuit patterns 155 may be provided on the second interconnection layer 154. An electrical signal transmitted from the outside through a first capacitor chip pad 157 may be provided to the capacitor layer 156 through the circuit patterns 155 provided in the second interconnection layer 154. The electrical signal changed through the capacitor layer 156 may be transmitted to the outside through the circuit patterns 155 of the second interconnection layer 154 and the capacitor chip pad 157.

In some embodiments, one or more capacitor chips 150 may be provided on the first surface 100a of the first semiconductor chip 100. For example, the number of the capacitor chip(s) 150 may range from 1 to 20. As illustrated in FIG. 1, the capacitor chips 150 may overlap with the first semiconductor chip 100 when viewed in a plan view. The capacitor chips 150 may be disposed on the first surface 100a of the first semiconductor chip 100 at various locations depending on criteria of the designer. Hereinafter, a single capacitor chip 150 will be mainly described for the purpose of ease and convenience in explanation. A first direction D1 may be parallel to the first surface 100a of the first semiconductor chip 100, and a second direction D2 may be parallel to the first surface 100a and perpendicular to the first direction D1. A third direction D3 may be perpendicular to the first direction D1 and the second direction D2 (e.g., perpendicular to the first surface 100a). The maximum width W2 of the capacitor chip 150 in the first direction D1 may be less than the maximum width W1 of the first semiconductor chip 100 in the first direction D1. For example, a ratio of the maximum width W2 of the capacitor chip 150 in the first direction D1 to the maximum width W1 of the first semiconductor chip 100 in the first direction D1 may range from 0.05 to 0.2. The maximum width W2 of the capacitor chip 150 in the first direction D1 may range from 0.1 mm to 1 mm. A width (or height) of the capacitor chip 150 in the third direction D3 may range from 10 μm to 100 μm.

[Die-to Wafer (D2W) Bonding]—FIG. 3A

According to some embodiments of the inventive concepts, the capacitor chip 150 may be fixed to the first semiconductor chip 100 through the capacitor chip pad 157. More particularly, the capacitor chip pad 157 may be disposed on the first chip pad 121 of the first semiconductor chip 100. The first chip pad 121 of the first semiconductor chip 100 may be vertically aligned with the capacitor chip pad 157. The capacitor chip pad 157 may be in contact with and directly coupled to the first chip pad 121. A thermal treatment process may be performed on the first chip pad 121 and the capacitor chip pad 157 to bond the first chip pad 121 and the capacitor chip pad 157 to each other. Thus, the capacitor chip 150 may be fixed to the first semiconductor chip 100. When an element is referred to as being "directly coupled" to another element, or as "contacting" or "in contact with" another element, there are no intervening elements present at the point of contact.

[Chip-On-Wafer (CoW) Bonding]—FIG. 3B

According to certain embodiments of the inventive concepts, a second connection portion 159 may be disposed between the capacitor chip pad 157 and the first chip pad 121 of the first semiconductor chip 100. The first chip pad 121, the second connection portion 159 and the capacitor chip pad 157 may be vertically aligned with each other. The second connection portion 159 may be or include a solder bump, such as a solder ball or a solder pillar. The second connection portion 159 may be in contact with the first chip pad 121 and the capacitor chip pad 157. The second connection portion 159 may connect the first chip pad 121 and the capacitor chip pad 157 to each other. A second underfill pattern 158 may be provided between the capacitor chip 150 and the first semiconductor chip 100. The second underfill pattern 158 may encapsulate (e.g., surround from a plan view) the second connection portion 159. The second underfill pattern 158 may include an insulating resin, for example, epoxy. Thus, the capacitor chip 150 may be fixed to the first semiconductor chip 100.

Referring again to FIG. 2A, an insulating layer 130 may be provided on the first surface 100a of the first semiconductor chip 100. The insulating layer 130 may include an insulating material. The insulating layer 130 may cover the first surface 100a of the first semiconductor chip 100 and may cover all sides surfaces and the top surface (facing downwardly in FIG. 2A) of the capacitor chip 150 to seal or encapsulate the capacitor chip 150. In some examples, the insulating layer 130 may not be formed on the top surface of the capacitor chip 150. In a vertical view, a sidewall of the insulating layer 130 may be coplanar with a sidewall of the first semiconductor chip 100. A first connection pad 355 may be provided on a bottom surface of the insulating layer 130. The first connection pad 355 may be horizontally spaced apart from the capacitor chip 150. The first connection pad 355 may not be vertically aligned with the capacitor chip 150.

A conductive post 135 may be disposed between the second chip pad 122 of the first semiconductor chip 100 and the first connection pad 355. More particularly, the conductive post 135 may penetrate the insulating layer 130 to connect the second chip pad 122 and the first connection pad 355 to each other. The conductive post 135 may be disposed in the insulating layer 130. The conductive post 135 may be surrounded by the insulating layer 130. The conductive post 135 may be formed of one or more metal materials, for example, the conducive post 135 may be formed of copper (Cu).

The redistribution layer 300 may be provided on the bottom surface of the insulating layer 130. The redistribution layer 300 may cover the bottom surface of the insulating layer 130 and may extend onto a bottom surface of a molding pattern 200 provided on the redistribution layer 300. The redistribution layer 300 may include first to third insulating patterns 310, 320 and 330 and first to third redistribution patterns 315, 325 and 335. The number of the insulating patterns 310, 320 and 330 and the number of the redistribution patterns 315, 325 and 335 may be variously changed. The first to third redistribution patterns 315, 325 and 335 may connect the first semiconductor chip 100 to a conductive structure 520, may connect the first semiconductor chip 100 to external connection terminals 400, and/or may connect the conductive structures 520 to the external connection terminals 400. The first to third insulating patterns 310, 320 and 330 may be sequentially stacked in the third direction D3. The first redistribution pattern 315 may be disposed between a terminal pad 410 and the second redistribution pattern 325. The second redistribution pattern 325 may be disposed between the first redistribution pattern 315 and the third redistribution pattern 335. The first connection pad 355 may be provided on the third redistribution pattern 335 and the third insulating pattern 330. The redistribution layer 300 may be formed in a panel level or a wafer level. A method of forming the redistribution layer 300 will be described later in detail with reference to FIG. 15.

The terminal pad 410 and the external connection terminal 400 may be provided on a bottom surface of the redistribution layer 300. More particularly, the terminal pad 410 and the external connection terminal 400 may be provided on the first redistribution pattern 315 exposed by the first insulating pattern 310. The terminal pad 410 may be disposed between the external connection terminal 400 and the first redistribution pattern 315 and may be electrically connected to the external connection terminal 400 and the first redistribution pattern 315. The external connection terminal 400 may be electrically connected to the first to third redistribution patterns 315, 325 and 335 through the terminal pad 410. In the present specification, it is understood that when a component is referred to as being electrically connected to the redistribution layer 300, it may be electrically connected to at least one of the first to third redistribution patterns 315, 325 and 335 of the redistribution layer 300. A thickness of the redistribution layer 300 may be less than a thickness of, for example, a printed circuit board. Since the first semiconductor package 10 includes the redistribution layer 300, the first semiconductor package 10 may be miniaturized.

[Electrical Connection Relation and Function]

The terminal pad 410, the external connection terminal 400, the first to third redistribution patterns 315, 325 and 335, the first connection pad 355, the conductive post 135, the first and second chip pads 121 and 122, the internal interconnection lines 123 and the vias 124 of the first interconnection layer 120, the capacitor chip pad 157, and the circuit patterns 155 may include a conductive material (e.g., a metal such as copper). A power supply current provided from the outside may flow into the first semiconductor chip 100 through the capacitor chip 150. For example, the power supply current provided from the outside may flow into the capacitor chip 150 through the external connection terminal 400, the terminal pad 410, the first to third redistribution patterns 315, 325 and 335, the first connection pad 355, the conductive post 135, and the first interconnection layer 120. The power supply current changed through the capacitor chip 150 may flow into integrated circuits of the first semiconductor chip 100 through the internal interconnection lines 123 and the vias 124 of the first interconnection layer 120.

The capacitor of the capacitor chip 150 may remove noise of an electrical signal and may buffer sudden fluctuation of the electrical signal. The sudden fluctuation of the electrical signal may be in proportion to a distance from the capacitor to the semiconductor chip, and thus the sudden fluctuation of the electrical signal may be reduced or prevented by disposing the capacitor adjacent to the semiconductor chip, thereby improving reliability of a semiconductor package. According to the embodiments of the inventive concepts, the capacitor chip 150 may be fixed on the first surface 100a of the first semiconductor chip 100, and thus the capacitor chip 150 and the first semiconductor chip 100 may be disposed adjacent to each other. As a result, the sudden fluctuation of the electrical signal provided into the first semiconductor chip 100 may be effectively removed to improve the reliability of the semiconductor package 1. In addition, the semiconductor package 1 may be miniaturized.

Referring again to FIG. 2A, a connection substrate 500 may be provided on the redistribution layer 300. The connection substrate 500 may have a hole 590 penetrating the connection substrate 500. For example, the hole 590 may be formed in a printed circuit board (PCB) to manufacture the connection substrate 500. For example, the connection substrate 500 may be a printed circuit board (PCB) having the hole 590 formed therein. The hole 590 may be disposed in a central portion of the connection substrate 500 when viewed in a plan view. The hole 590 may expose a top surface of the redistribution layer 300. The connection substrate 500 may include a base layer 510 and the conductive structure 520. The base layer 510 may include stacked base layers 510. The base layers 510 may include an insulating material. For example, the base layers 510 may include a thermosetting resin (e.g., an epoxy resin), a thermoplastic resin (e.g., polyimide), or an insulating material in which the resin is impregnated into a core material (e.g., an inorganic filler and/or a glass fiber (or glass cloth or glass fabric)), e.g., prepreg, an Ajinomoto build-up film (ABF), FR-4, or bismaleimide triazine (BT). The hole 590 penetrates the base layers 510. The conductive structure 520 may be provided in and extend through the base layers 510. The conductive structure 520 may include a first pad 521, a conductive interconnection line 523, vias 524, and a second pad 522. The first pad 521 may be provided on a bottom surface of the connection substrate 500. The conductive interconnection line 523 may be disposed between the base layers 510. The vias 524 may penetrate the base layers 510 and may be connected to the conductive interconnection line 523. The second pad 522 may be disposed on a top surface of the connection substrate 500 and may be connected to at least one of the vias 524. The second pad 522 may be electrically connected to the first pad 521 through the vias 524 and the conductive interconnection line 523. The number and/or arrangement of the second pad(s) 522 may be different from the number and/or arrangement of the first pad(s) 521. The conductive structure 520 may be formed of one or metals. For example, the conductive structure 520 may be and/or include at least one of copper, aluminum, gold, lead, stainless steel, silver, iron, or any alloy thereof.

The molding pattern 200 may be provided on the first semiconductor chip 100 and the connection substrate 500. More particularly, the molding pattern 200 may extend between the first semiconductor chip 100 in hole 590 and the connection substrate 500 surrounding the first semiconductor chip 100 (from a top down view) to seal or encapsulate the first semiconductor chip 100. The first semiconductor chip 100 may be fixed to the connection substrate 500 by the molding pattern 200. The molding pattern 200 may be and/or include an insulating polymer such as an epoxy-based polymer. For example, the molding pattern 200 may be and/or include an adhesive insulating film such as an Ajinomoto build-up film (ABF).

An upper hole 290 may be provided in the molding pattern 200. The upper hole 290 may expose the second pad 522 of the conductive structure 520. The connection terminal 750 may be provided on a top surface of the second pad 522. More particularly, the connection terminal 750 may be disposed between the second pad 522 and a metal pad 705 of the package substrate 710 to electrically connect the second pad 522 and the metal pad 705. Thus, the second semiconductor package 30 may be electrically connected to the first semiconductor chip 100 and the external connection terminal 400 through the connection terminal 750. According to the embodiments, since the connection substrate 500 is provided, the connection terminal 750 may be disposed freely. For example, the number and arrangement of the connection terminal(s) 750 may not be limited to the number and arrangement of the first pad(s) 521. As a result, integrated circuits in the package substrate 710 may be disposed freely.

The second semiconductor package 30 may be provided on the first semiconductor package 10. The second semiconductor package 30 may include the package substrate 710, the second semiconductor chip 720, and the upper molding pattern 730. For example, the package substrate 710 may be a printed circuit board (PCB). Alternatively, the redistribution layer 300 described above may be used as the package substrate 710. The metal pad 705 may be disposed on a bottom surface of the package substrate 710. The second semiconductor chip 720 may be disposed on the package substrate 710. The second semiconductor chip 720 may include a memory circuit, a logic circuit, or a combination thereof. As illustrated by a dotted line in FIG. 2A, the second semiconductor chip 720 may be electrically connected to the metal pad 705 through the package substrate 710. In FIG. 2A, the dotted line in the package substrate 710 schematically illustrates an interconnection line in the package substrate 710. The upper molding pattern 730 may be disposed on the package substrate 710 to cover the second semiconductor chip 720. The upper molding pattern 730 may include an insulating polymer such as an epoxy-based polymer.

Figure 2B:
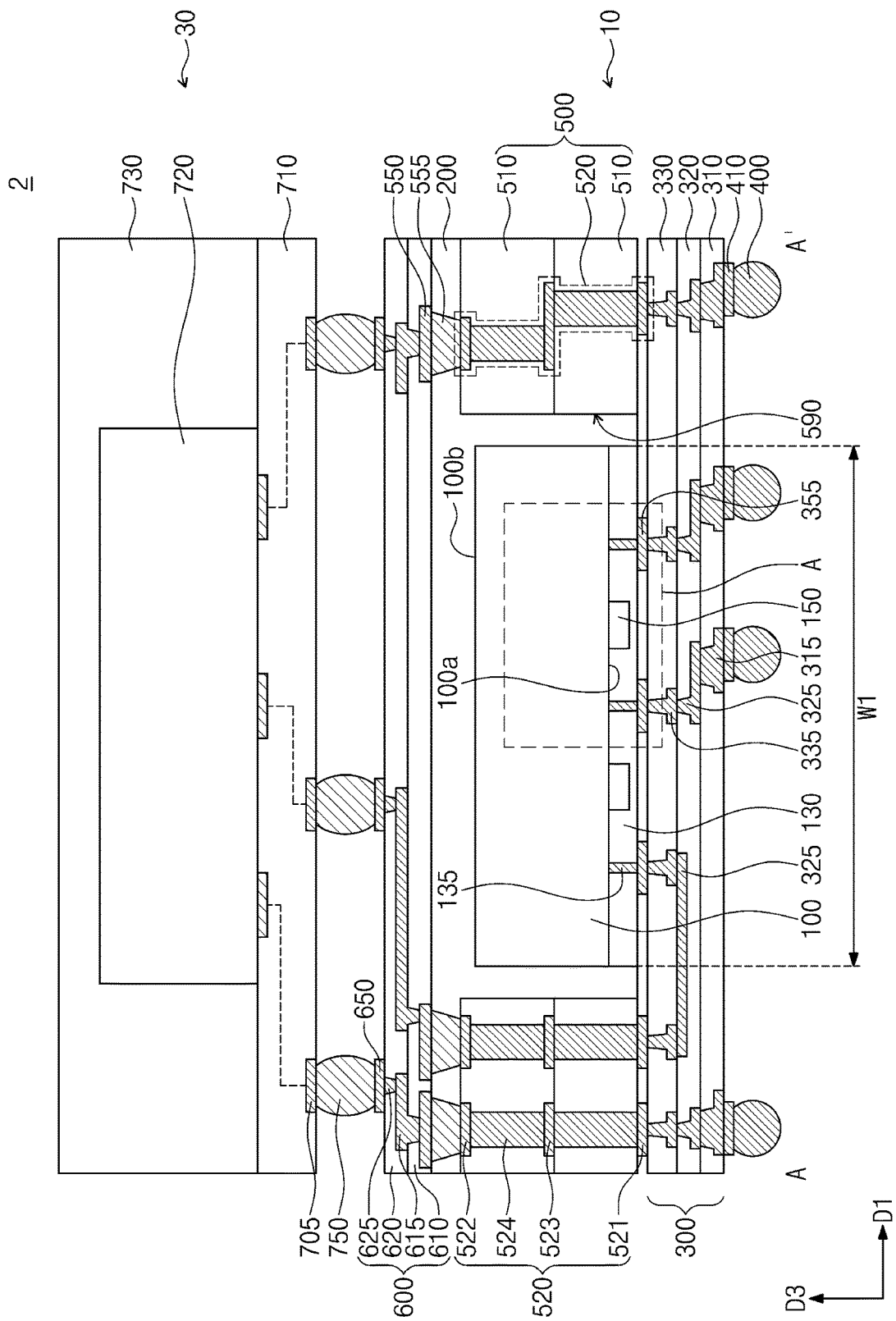

FIG. 2B is a cross-sectional view taken along the line A-A' of FIG. 1. Hereinafter, the descriptions to the same components and features as in the above embodiments will be omitted for the purpose of ease and convenience in explanation. In other words, differences between the present embodiments and the above embodiments will be mainly described.

Referring to FIG. 2B, a semiconductor package 2 according to some embodiments may further include an upper redistribution layer 600 in addition to the first semiconductor package 10 and the second semiconductor package 30.

The upper redistribution layer 600 may be provided on a top surface of the molding pattern 200. The upper redistribution layer 600 may include a first upper insulating pattern 610, a second upper insulating pattern 620, a first upper redistribution pattern 615, and a second upper redistribution pattern 625. The first upper insulating pattern 610 may be provided on the molding pattern 200. The first upper insulating pattern 610 may include a photosensitive polymer. The first upper redistribution pattern 615 may be provided on the first upper insulating pattern 610 and may extend into the first upper insulating pattern 610. The first upper redistribution pattern 615 may be provided on a first conductive pad 550. The first upper redistribution pattern 615 may be electrically connected to a conductive portion 555 through the first conductive pad 550. The second upper insulating pattern 620 may be provided on the first upper insulating pattern 610 to cover the first upper redistribution pattern 615. The second upper insulating pattern 620 may include a photosensitive polymer. The second upper redistribution pattern 625 may be provided in the second upper insulating pattern 620. Unlike FIG. 2B, the second upper redistribution pattern 625 may further extend onto a top surface of the second upper insulating pattern 620. The first and second upper redistribution patterns 615 and 625 may include a metal such as copper. The number of the upper insulating patterns 610 and 620 and the number of the upper redistribution patterns 615 and 625 may be variously changed. A second conductive pad 650 may be provided on the upper redistribution layer 600 and may be connected to the second upper redistribution pattern 625. The second conductive pad 650 may be electrically connected to the first semiconductor chip 100 or the external connection terminal 400 through the upper redistribution patterns 615 and 625 and the conductive structure 520. The second conductive pad 650 may include a metal. The second conductive pad 650 may not be vertically aligned with the second pad 522. For example, the second conductive pad 650 may overlap with the first semiconductor chip 100 when viewed in a plan view. The arrangement of the second conductive pad 650 may not be limited to the arrangement of the second pad 522.

Figure 4A:
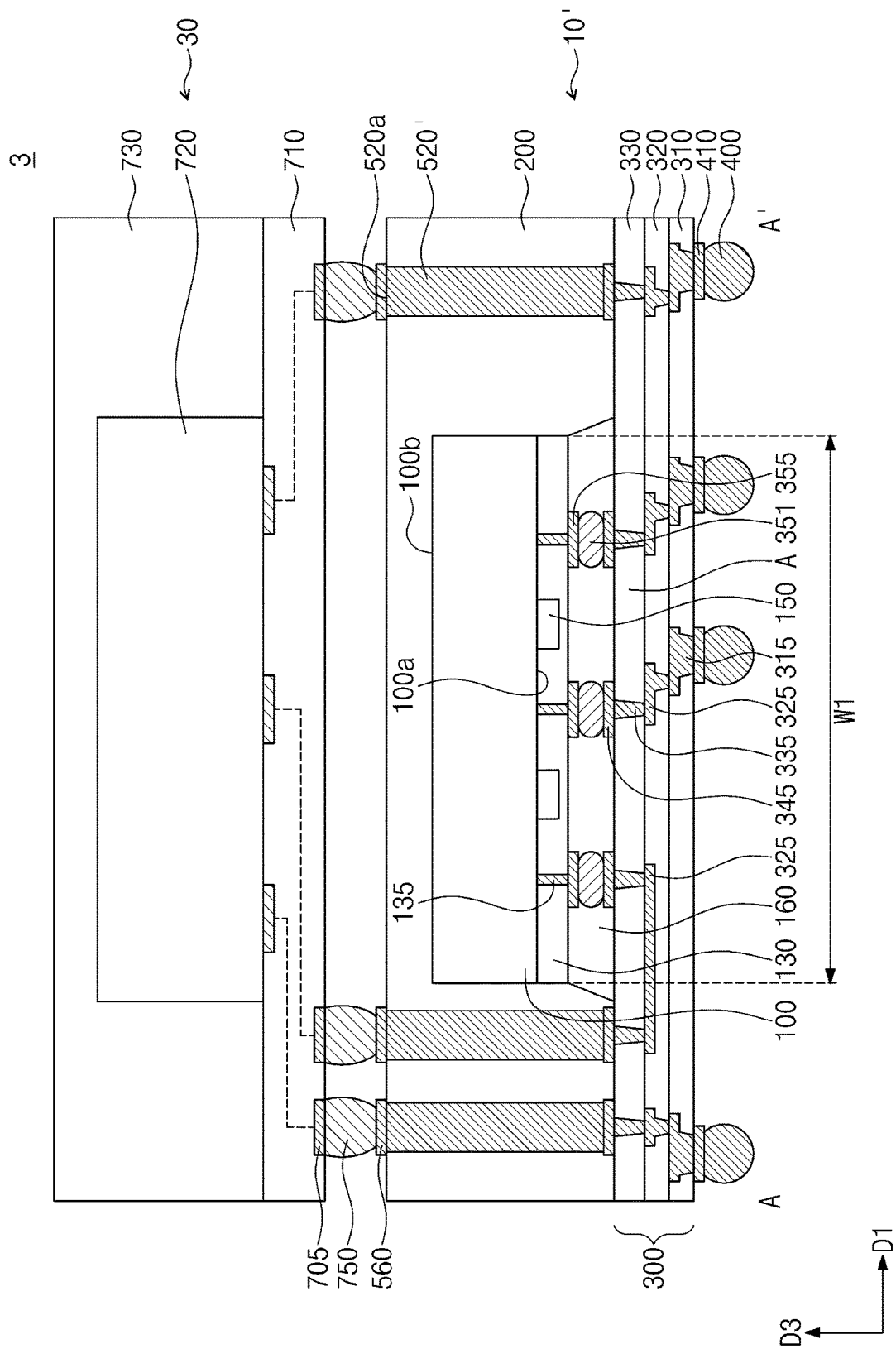
FIGS. 4A and 4B are cross-sectional views corresponding to the line A-A' of FIG. 1 to illustrate semiconductor packages according to some embodiments of the inventive concepts.

FIG. 4A is a cross-sectional view corresponding to the line A-A' of FIG. 1 to illustrate a semiconductor package according to some embodiments of the inventive concepts. Hereinafter, the descriptions to the same components and features as in the above embodiments will be omitted for the purpose of ease and convenience in explanation. In other words, differences between the present embodiments and the above embodiments will be mainly described.

Referring to FIG. 4A, a semiconductor package 3 according to some embodiments may include a first semiconductor package 10' and the second semiconductor package 30. The first semiconductor package 10' may include a first semiconductor chip 100, a capacitor chip 150, a redistribution layer 300, a second connection pad 345, a first connection portion 351 disposed between the first and second connection pads 345 and 355, and a first underfill pattern 160. The first semiconductor chip 100, the capacitor chip 150 and the redistribution layer 300 may be the same as described with reference to FIG. 2A.

The second connection pad 345 may be provided on the third redistribution pattern 335 and the third insulating pattern 330. The first connection portion 351 may be disposed between the first connection pad 355 and the second connection pad 345. The first connection pad 355, the first connection portion 351 and the second connection pad 345 may be vertically aligned with each other. The first connection portion 351 may include at least one of a solder ball, a bump, or a pillar. The first connection portion 351 may be in contact with the first connection pad 355 and the second connection pad 345. The first connection portion 351 may connect the first connection pad 355 and the second connection pad 345 to each other. The first underfill pattern 160 may be provided between the insulating layer 130 and the redistribution layer 300. The first underfill pattern 160 may seal the first connection portion 351. The first underfill pattern 160 may include an insulating resin, for example, epoxy.

Instead of the connection substrate 500, a conductive structure 520' penetrating the molding pattern 200 may be provided on the top surface of the redistribution layer 300. For example, the conductive structure 520' may have a metal pillar shape. The conductive structure 520' may extend in parallel to a sidewall of the molding pattern 200 (e.g., the third direction D3). The conductive structure 520' may be spaced apart from the first semiconductor chip 100. A plurality of the conductive structures 520' may be arranged to surround the first semiconductor chip 100 when viewed in a plan view. The molding pattern 200 may be provided on the top surface of the redistribution layer 300 to cover the first semiconductor chip 100. The molding pattern 200 may surround a sidewall of the conductive structure 520' and may extend between the conductive structure 520' and the first semiconductor chip 100. The molding pattern 200 may expose a top surface 520a of the conductive structure 520'. A third connection pad 560 may be provided on the top surface 520a of the conductive structure 520'. The connection terminal 750 may be provided on a top surface of the third connection pad 560. The second semiconductor package 30 may be connected to a top surface of the connection terminal 750.

[Electrical Connection Relation and Function]

The terminal pad 410, the external connection terminal 400, the first to third redistribution patterns 315, 325 and 335, the first and second connection pads 355 and 345, the first connection portion 351, the conductive post 135, the first and second chip pads 121 and 122, the internal interconnection lines 123 and the vias 124 of the first interconnection layer 120, the capacitor chip pad 157, and the circuit patterns 155 may include a conductive material (e.g., a metal such as copper). A power supply current provided from the outside may flow into the first semiconductor chip 100 through the capacitor chip 150. For example, the power supply current provided from the outside may flow into the capacitor chip 150 through the external connection terminal 400, the terminal pad 410, the first to third redistribution patterns 315, 325 and 335, the first and second connection pads 355 and 345, the conductive post 135, and the first interconnection layer 120. The power supply current changed through the capacitor chip 150 may flow into integrated circuits of the first semiconductor chip 100 through the internal interconnection lines 123 and the vias 124 of the first interconnection layer 120.

Figure 4B:
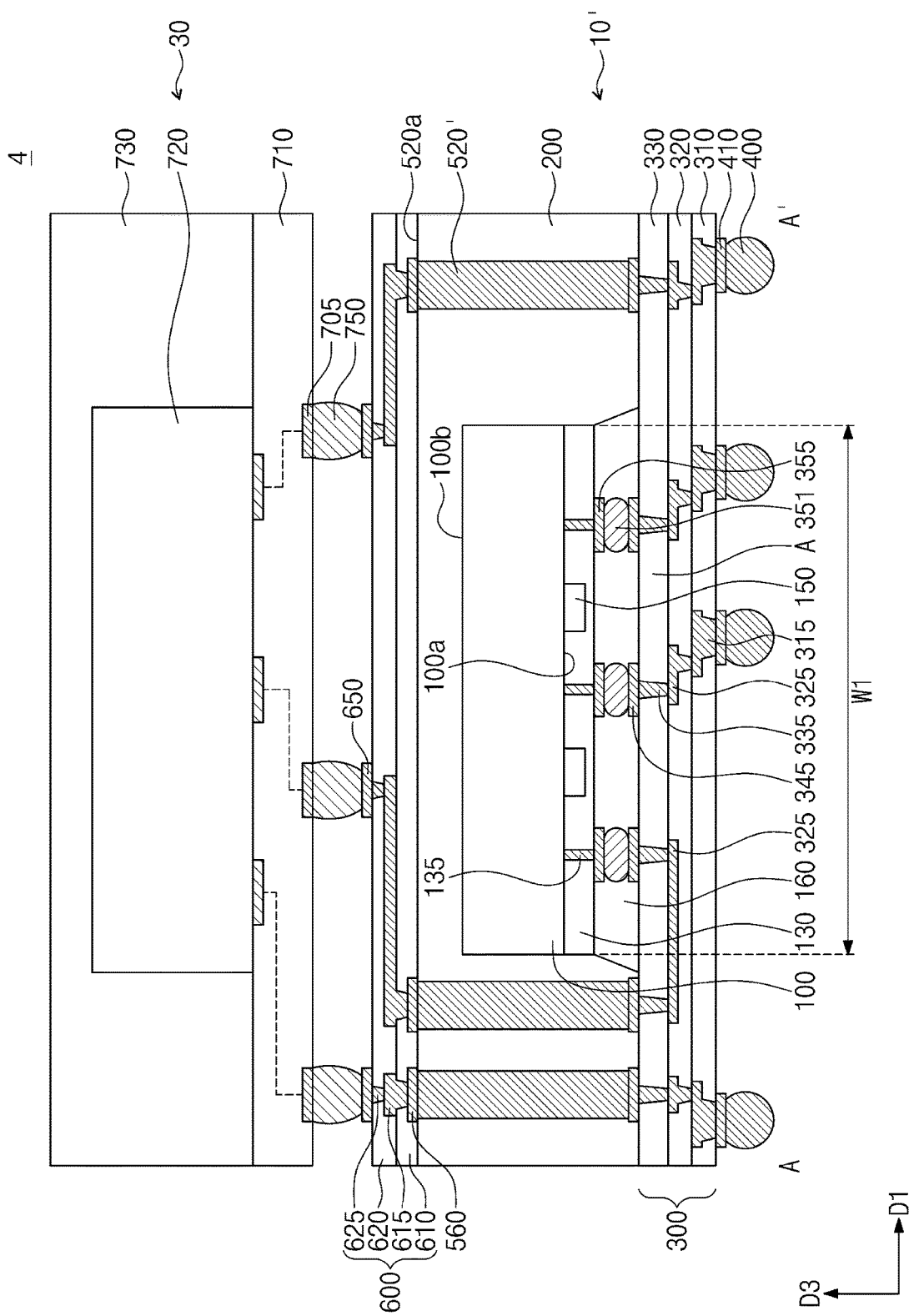

FIG. 4B is a cross-sectional view corresponding to the line A-A' of FIG. 1 to illustrate a semiconductor package according to some embodiments of the inventive concepts. Hereinafter, the descriptions to the same components and features as in the above embodiments will be omitted for the purpose of ease and convenience in explanation. In other words, differences between the present embodiments and the above embodiments will be mainly described.

Referring to FIG. 4B, a semiconductor package 4 according to some embodiments may further include an upper redistribution layer 600 in addition to the first semiconductor package 10' and the second semiconductor package 30.

The upper redistribution layer 600 may be provided on a top surface of the molding pattern 200. The upper redistribution layer 600 may include a first upper insulating pattern 610, a second upper insulating pattern 620, a first upper redistribution pattern 615, and a second upper redistribution pattern 625. The first upper insulating pattern 610 may be provided on the molding pattern 200. The first upper redistribution pattern 615 may be connected to the third connection pad 560. The second upper insulating pattern 620 may be provided on the first upper insulating pattern 610 to cover the first upper redistribution pattern 615. The second upper redistribution pattern 625 may be provided in the second upper insulating pattern 620. The number of the upper insulating patterns 610 and 620 and the number of the upper redistribution patterns 615 and 625 may be variously changed. A second conductive pad 650 may be provided on the upper redistribution layer 600 and may be connected to the second upper redistribution pattern 625. The second conductive pad 650 may be electrically connected to the first semiconductor chip 100 or the external connection terminal 400 through the upper redistribution patterns 615 and 625 and the conductive structure 520'.

Figure 5:
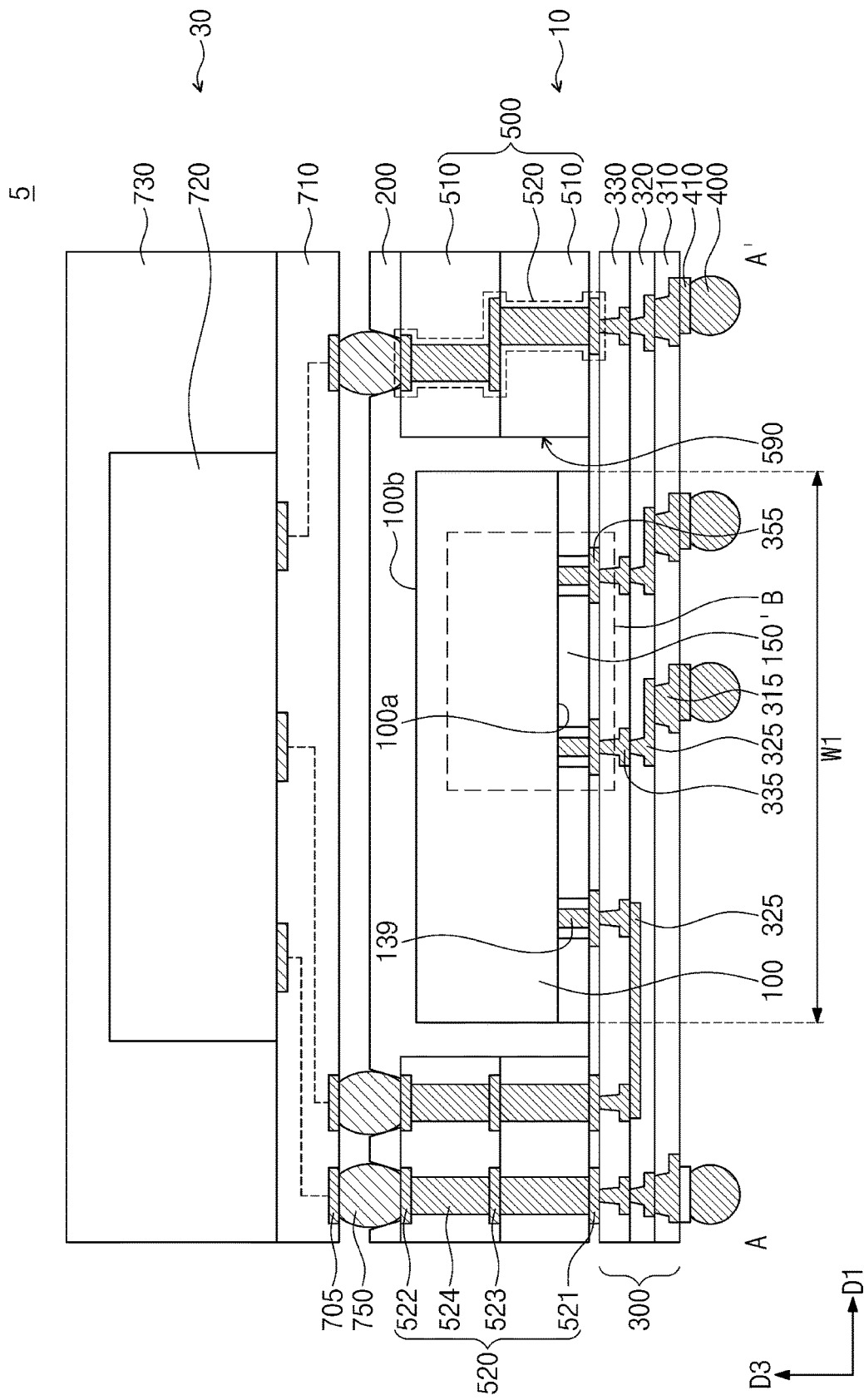
FIG. 5 is a cross-sectional view illustrating a semiconductor package according to some embodiments of the inventive concepts.
Figure 6:
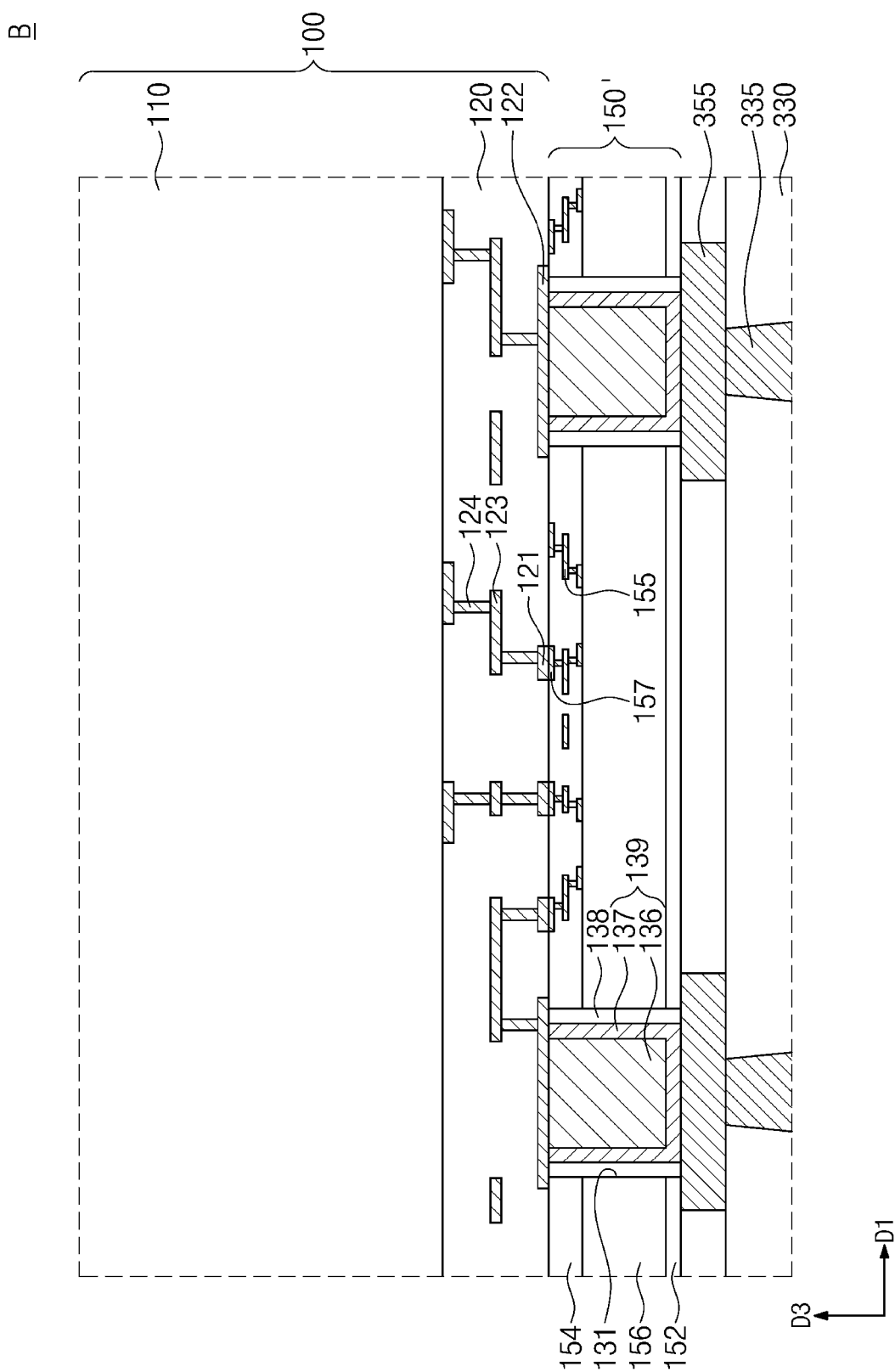
FIG. 6 is an enlarged view of a region 'B' of FIG. 5.

FIG. 5 is a cross-sectional view illustrating a semiconductor package according to some embodiments of the inventive concepts. FIG. 6 is an enlarged view of a region 'B' of FIG. 5. Hereinafter, the descriptions to the same components and features as in the above embodiments will be omitted for the purpose of ease and convenience in explanation. In other words, differences between the present embodiments and the above embodiments will be mainly described.

Referring to FIGS. 5 and 6, a semiconductor package 5 according to some embodiments may include a first semiconductor package 10 and a second semiconductor package 30. The first semiconductor package 10 may include a first semiconductor chip 100, a capacitor chip 150', and a redistribution layer 300. The first semiconductor chip 100 may be substantially the same as described with reference to FIG. 2A.

The capacitor chip 150' may be provided on the first surface 100a of the first semiconductor chip 100. The capacitor chip 150' may cover the first surface 100a of the first semiconductor chip 100. The capacitor chip 150' may include a base substrate 152, a capacitor layer 156, and a second interconnection layer 154. A planar area of the capacitor chip 150' described in FIG. 5 may be different from a planar area of the capacitor chip 150 described in FIG. 2A. For example, the embodiment of FIG. 5 may be implemented with a capacitor chip 150' such as one that extends across first surface 100a from one sidewall of the first semiconductor chip 100 to an opposite sidewall of the first semiconductor chip 100. In some examples, a single capacitor chip 150' may be implemented with the embodiment of FIG. 5, such single capacitor chip 150' having the same footprint as the first semiconductor chip 100 (e.g., having the same dimensions in the D1 and D2 directions and having sidewalls aligned with corresponding sidewalls of the semiconductor chip 100). This latter embodiment may be in contrast to embodiments (e.g., the embodiment of FIG. 2A) where plural discrete capacitor chips 150' may be attached to the first surface 100a of the first semiconductor chip 100.

The capacitor chip 150' may overlap with the first semiconductor chip 100 when viewed in a plan view. A sidewall of the capacitor chip 150' may be vertically aligned with a sidewall of the first semiconductor chip 100. The capacitor chip 150' may be fixed on the first surface 100a of the first semiconductor chip 100 by a wafer-to-wafer bonding method. More particularly, a capacitor chip pad 157 of the capacitor chip 150' may be disposed on the first chip pad 121 of the first semiconductor chip 100, as illustrated in FIG. 6. The first chip pad 121 of the first semiconductor chip 100 may be vertically aligned with the capacitor chip pad 157. The capacitor chip pad 157 may be in contact with the first chip pad 121. A thermal treatment process may be performed on the first chip pad 121 and the capacitor chip pad 157 to bond the first chip pad 121 and the capacitor chip pad 157 to each other. Thus, the capacitor chip 150' may be fixed to the first semiconductor chip 100.

A through-structure 139 may be disposed between the second chip pad 122 of the first semiconductor chip 100 and the first connection pad 355. More particularly, the capacitor chip 150' may have a through-hole 131 penetrating the capacitor chip 150'. The through-structure 139 may be provided in the through-hole 131. The through-structure 139 may include a liner layer 138, a barrier pattern 137, and a conductive pattern 136. The liner layer 138 may cover a sidewall of the through-hole 131 and may expose the first connection pad 355. For example, the liner layer 138 may include silicon oxide, silicon nitride, silicon oxynitride, or a low-k dielectric material. The liner layer 138 may conformally cover the sidewall of the through-hole 131.

The barrier pattern 137 may be formed on the liner layer 138 and the first connection pad 355. The barrier pattern 137 may include titanium (Ti), titanium nitride (TiN), tantalum (Ta), tantalum nitride (TaN), or any combination thereof. The conductive pattern 136 may be formed on the barrier pattern 137 to fill the through-hole 131. The conductive pattern 136 may include copper or tungsten.

A top surface of the through-structure 139 may be substantially coplanar with a top surface of the capacitor chip 150'. The top surface of the through-structure 139 may be connected to the second chip pad 122 of the first semiconductor chip 100, and a bottom surface of the through-structure 139 may be connected to the first connection pad 355.

Figure 7:
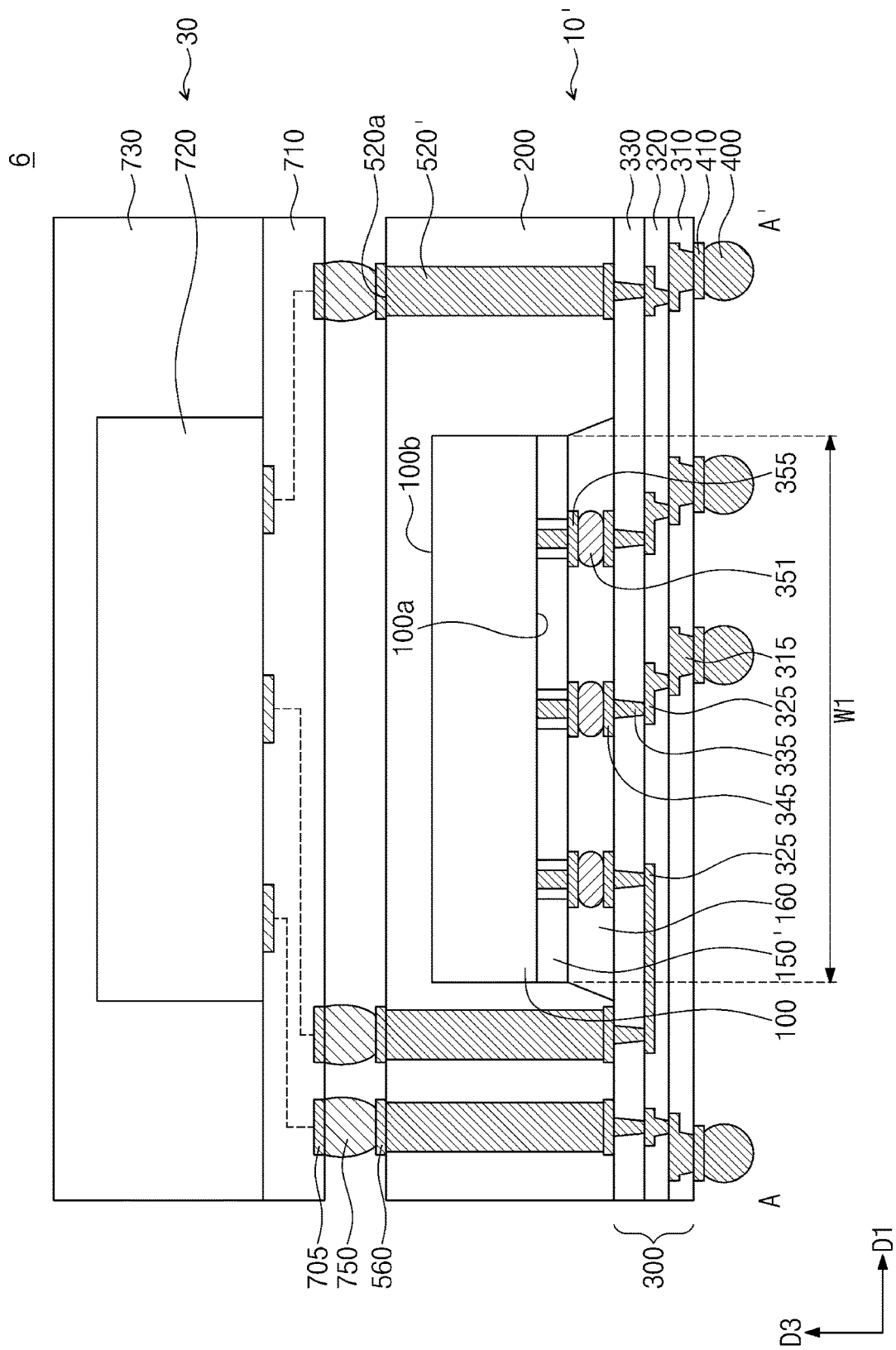
FIG. 7 is a cross-sectional view illustrating a semiconductor package according to some embodiments of the inventive concepts.

FIG. 7 is a cross-sectional view illustrating a semiconductor package according to some embodiments of the inventive concepts. Hereinafter, the descriptions to the same components and features as in the above embodiments will be omitted for the purpose of ease and convenience in explanation. In other words, differences between the present embodiments and the above embodiments will be mainly described.

Referring to FIG. 7, a semiconductor package 6 according to some embodiments may include a first semiconductor package 10' and the second semiconductor package 30.

Instead of the connection substrate 500, a conductive structure 520' penetrating the molding pattern 200 may be provided on the top surface of the redistribution layer 300. For example, the conductive structure 520' may have a metal pillar shape. The conductive structure 520' may extend in parallel to the sidewall of the molding pattern 200 (e.g., the third direction D3). The conductive structure 520' may be spaced apart from the first semiconductor chip 100. A plurality of the conductive structures 520' may be arranged to surround the first semiconductor chip 100 when viewed in a plan view. The molding pattern 200 may be provided on the top surface of the redistribution layer 300 to cover the first semiconductor chip 100. The molding pattern 200 may surround a sidewall of the conductive structure 520' and may extend between the conductive structure 520' and the first semiconductor chip 100. The molding pattern 200 may expose the top surface 520a of the conductive structure 520'. The third connection pad 560 may be provided on the top surface 520a of the conductive structure 520'. The connection terminal 750 may be provided on the top surface of the third connection pad 560. The second semiconductor package 30 may be connected to the top surface of the connection terminal 750.

[Manufacturing Method]

Figure 8:
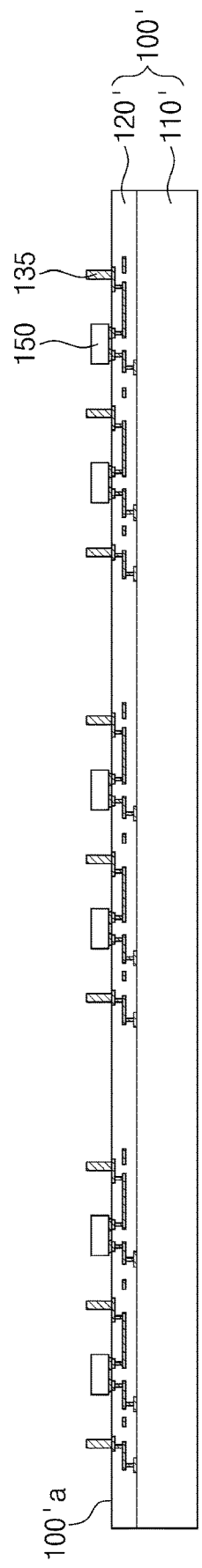
FIGS. 8 to 10 are cross-sectional views illustrating a method of manufacturing a semiconductor device according to some embodiments of the inventive concepts.
Figure 9:
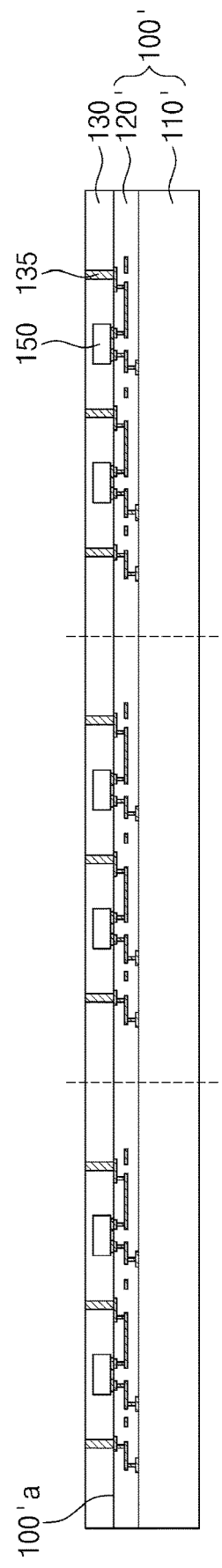
Figure 10:
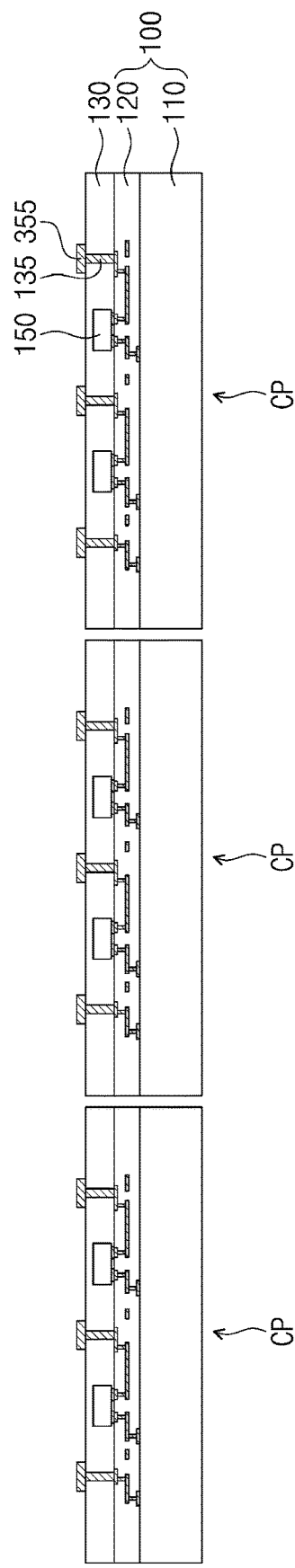

FIGS. 8 to 10 are cross-sectional views illustrating a method of manufacturing a semiconductor device according to some embodiments of the inventive concepts.

Referring to FIGS. 3A and 8, a first semiconductor substrate 100' may be prepared. The first semiconductor substrate 100' may include a first base layer 110' and a first interconnection layer 120'. Capacitor chips 150 and conductive posts 135 may be formed on a first surface 100'a of the first semiconductor substrate 100'. More particularly, the capacitor chip 150 may be aligned in such a way that a capacitor chip pad 157 comes in contact with a first chip pad 121 exposed at the first surface 100'a. Thereafter, a thermal treatment process may be performed to fix the capacitor chip 150 on the first semiconductor substrate 100'. The conductive post 135 may be provided on a second chip pad 122 exposed at the first surface 100'a. The conductive post 135 may be formed using exposure and development processes. The conductive post 135 may be spaced apart from the capacitor chip 150.

Referring to FIG. 9, an insulating layer 130 may be formed on the first surface 100'a of the first semiconductor substrate 100'. The insulating layer 130 may cover the first surface 100'a and may cover a top surface and a sidewall of the conductive post 135. The insulating layer 130 may seal or encapsulate the capacitor chip 150. For example, the insulating layer 130 may include an insulating resin such as an epoxy molding compound (EMC). A planarization process may be performed to remove a portion of the insulating layer 130. Thus, the top surface of the conductive post 135 may be substantially coplanar with a top surface of the insulating layer 130 and may be exposed to the outside.

Referring to FIGS. 9 and 10, a first connection pad 355 may be formed on the exposed top surface of the conductive post 135. A patterning process of forming the first connection pad 355 may be performed using exposure and development processes. The development process may be a positive-tone development (PTD) process or a negative-tone development (NTD) process. The first semiconductor substrate 100' and the insulating layer 130 may be sawed along dotted lines, and thus a plurality of semiconductor devices CP may be separated from each other.

Figure 11:
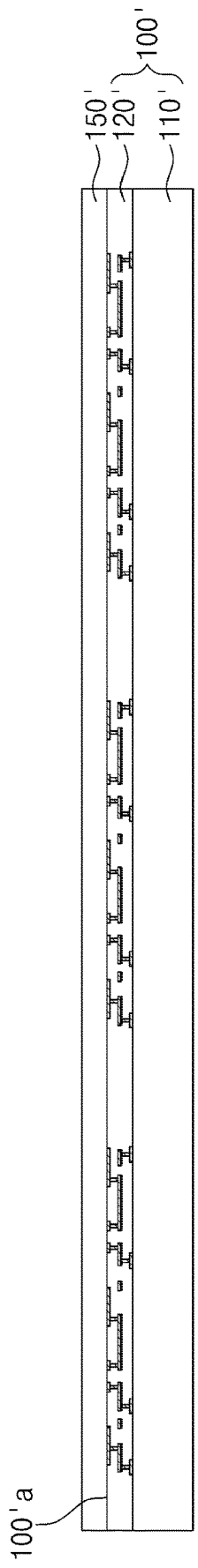
FIGS. 11 to 13 are cross-sectional views illustrating a method of manufacturing a semiconductor device according to some embodiments of the inventive concepts.
Figure 12:
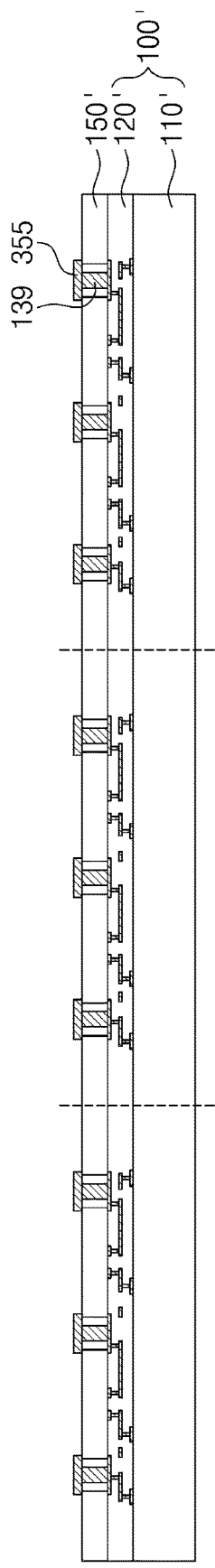
Figure 13:
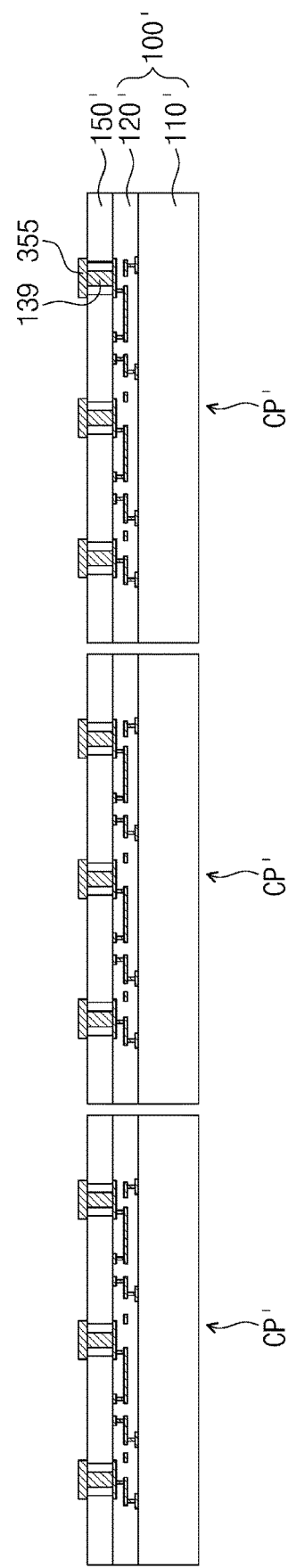

FIGS. 11 to 13 are cross-sectional views illustrating a method of manufacturing a semiconductor device according to some embodiments of the inventive concepts. Hereinafter, the descriptions to the same components and features as in the above embodiments will be omitted for the purpose of ease and convenience in explanation. In other words, differences between the present embodiments and the above embodiments will be mainly described.

Referring to FIGS. 6 and 11, the first semiconductor substrate 100' may be prepared. A capacitor chip 150' may be fixed on the first surface 100'a of the first semiconductor substrate 100'. More particularly, the capacitor chip 150' may be disposed on the first surface 100'a of the first semiconductor substrate 100' in such a way that the first chip pad 121 exposed at the first surface 100'a is aligned with the capacitor chip pad 157 of the capacitor chip 150'. Thereafter, a thermal treatment process may be performed to bond the first chip pad 121 and the capacitor chip pad 157 to each other.

Referring to FIGS. 6 and 12, a through-hole 131 penetrating the capacitor chip 150' may be formed in the capacitor chip 150'. The through-hole 131 may expose the second chip pad 122. A through-structure 139 may be formed in the through-hole 131. For example, a liner layer 138, a barrier pattern 137, and a conductive pattern 136 may be sequentially formed in the through-hole 131. More particularly, the liner layer 138 may be formed to conformally cover an inner sidewall of the through-hole 131, and then, a seed layer may be formed on a surface of the liner layer 138. An electroplating process may be performed using the seed layer as an electrode to form the barrier pattern 137. An electroplating process may further be performed to form the conductive pattern 136 filling the through-hole 131.

Referring to FIGS. 12 and 13, a first connection pad 355 may be formed on a surface of the through-structure 139, which is exposed to the outside. A patterning process of forming the first connection pad 355 may be performed using exposure and development processes. The development process may be a positive-tone development (PTD) process or a negative-tone development (NTD) process. The first semiconductor substrate 100' and the capacitor chip 150' may be sawed along dotted lines, and thus a plurality of semiconductor devices CP' may be separated from each other.

FIGS. 14 to 17 are cross-sectional views illustrating a method of manufacturing a semiconductor package according to some embodiments of the inventive concepts.

Figure 14:
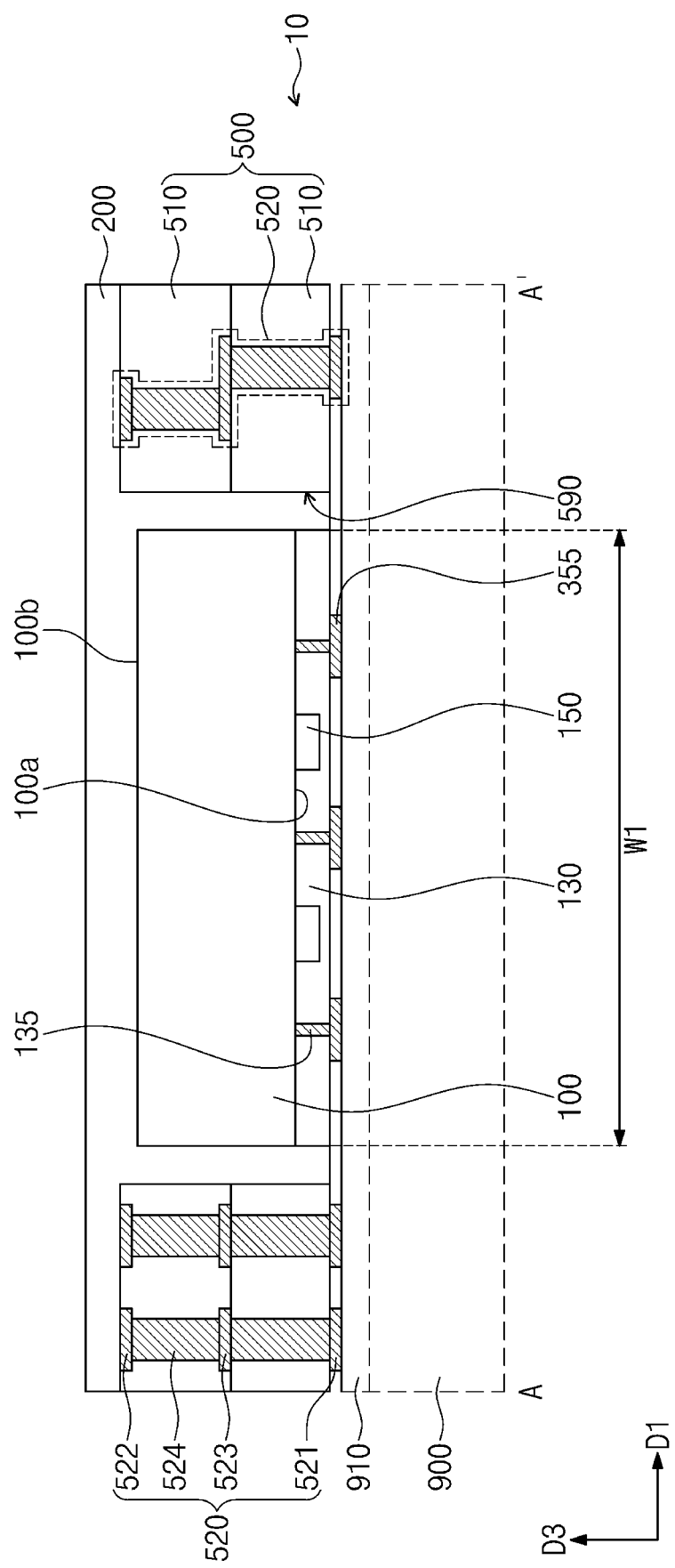
FIGS. 14 to 17 are cross-sectional views illustrating a method of manufacturing a semiconductor package according to some embodiments of the inventive concepts.

Referring to FIG. 14, a carrier substrate 900 may be prepared. A connection substrate 500 may be provided on the carrier substrate 900. A carrier adhesive layer 910 may be disposed between the carrier substrate 900 and the connection substrate 500. The semiconductor device CP or CP' may be disposed in a hole 590 of the connection substrate 500. A molding pattern 200 may be formed to cover a top surface of the connection substrate 500 and the first semiconductor chip 100. The molding pattern 200 may be formed to fill a gap between the connection substrate 500 and the first semiconductor chip 100.

Figure 15:
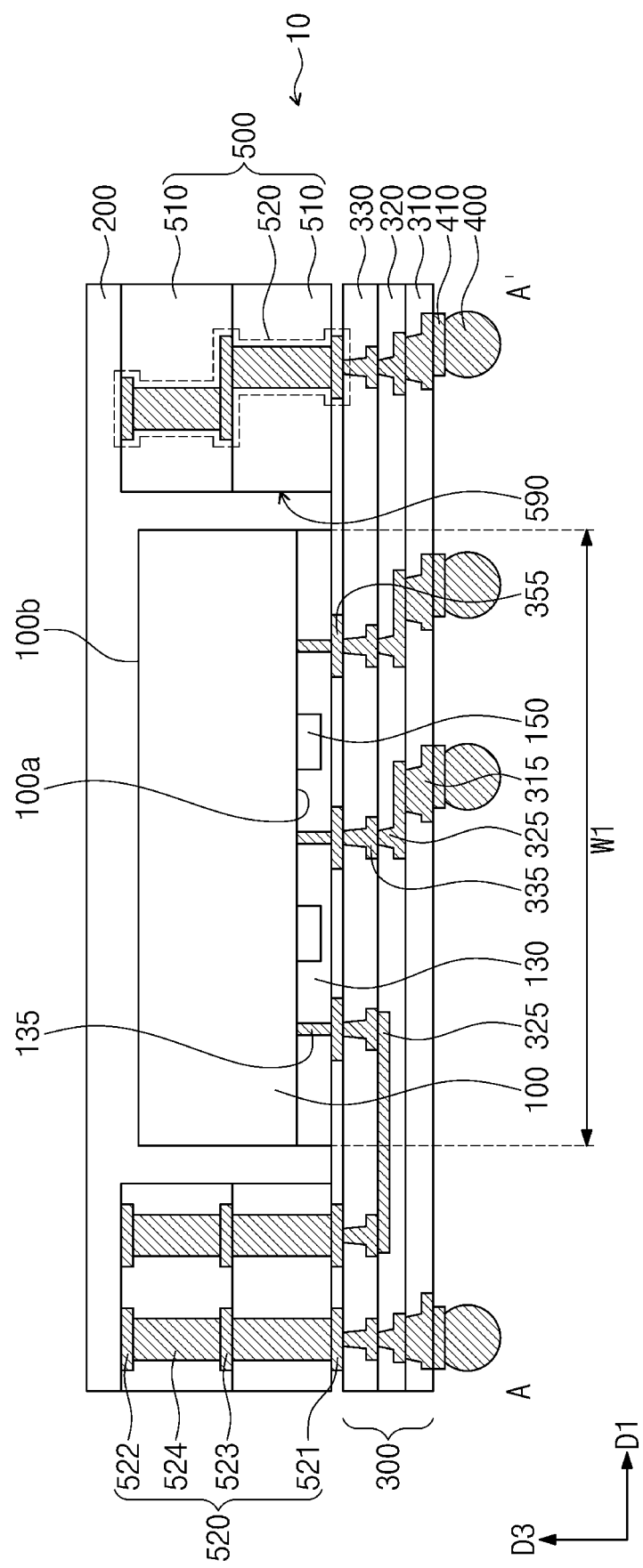

Referring to FIG. 15, the carrier substrate 900 and the carrier adhesive layer 910 may be removed. A redistribution layer 300 may be manufactured by forming a first insulating pattern 310, a first redistribution pattern 315, a second insulating pattern 320, a second redistribution pattern 325, a third insulating pattern 330, and a third redistribution pattern 335 on a bottom surface of the connection substrate 500 and the first connection pad 355. At this time, the first connection pad 355 may be connected to the third redistribution pattern 335.

Each of the first to third insulating patterns 310, 320 and 330 may include a photosensitive polymer. Processes of patterning the first to third insulating patterns 310, 320 and 330 may be performed by exposure and development processes. The first to third redistribution patterns 315, 325 and 335 may be formed by electroplating processes. More particularly, portions of the first to third insulating patterns 310, 320 and 330 may be removed to form openings, seed patterns may be formed in the openings, and then, the first to third redistribution patterns 315, 325 and 335 may be formed by the electroplating processes using the seed patterns. A terminal pad 410 and an external connection terminal 400 may be formed on the first redistribution pattern 315.

Figure 16:
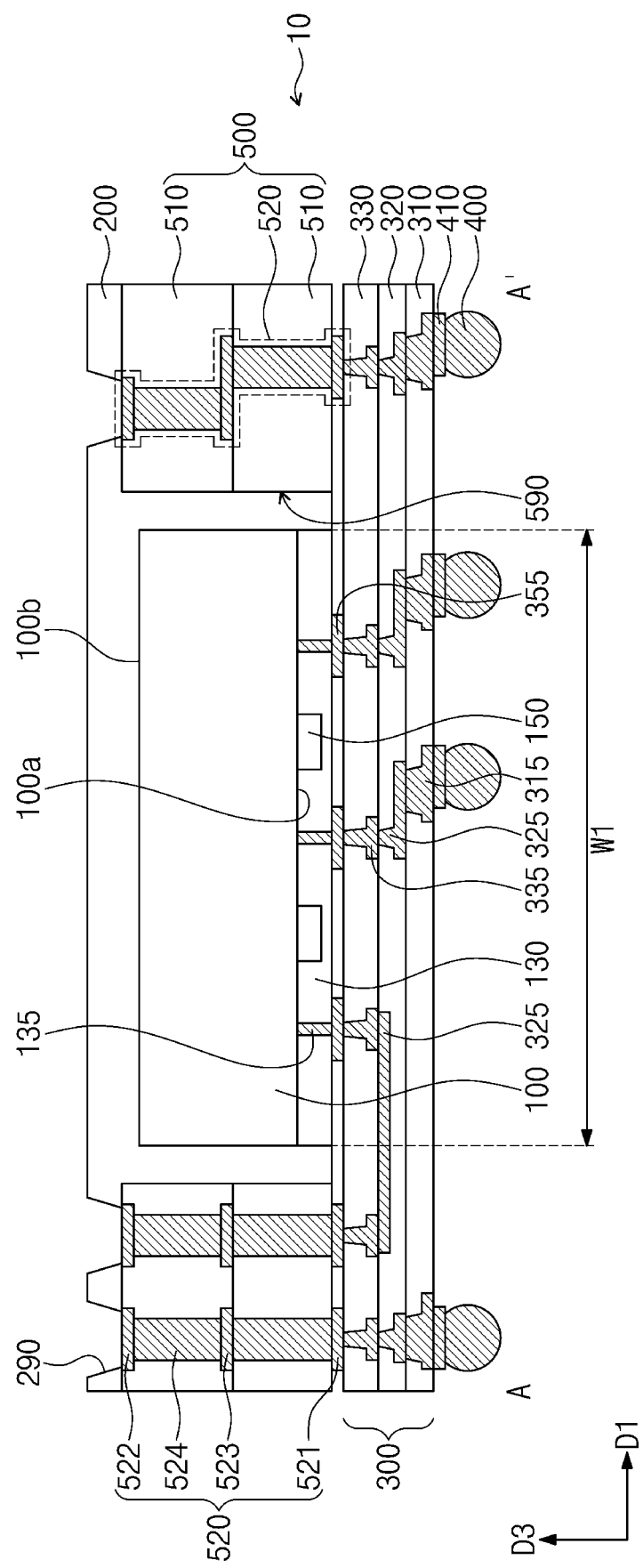
Figure 17:
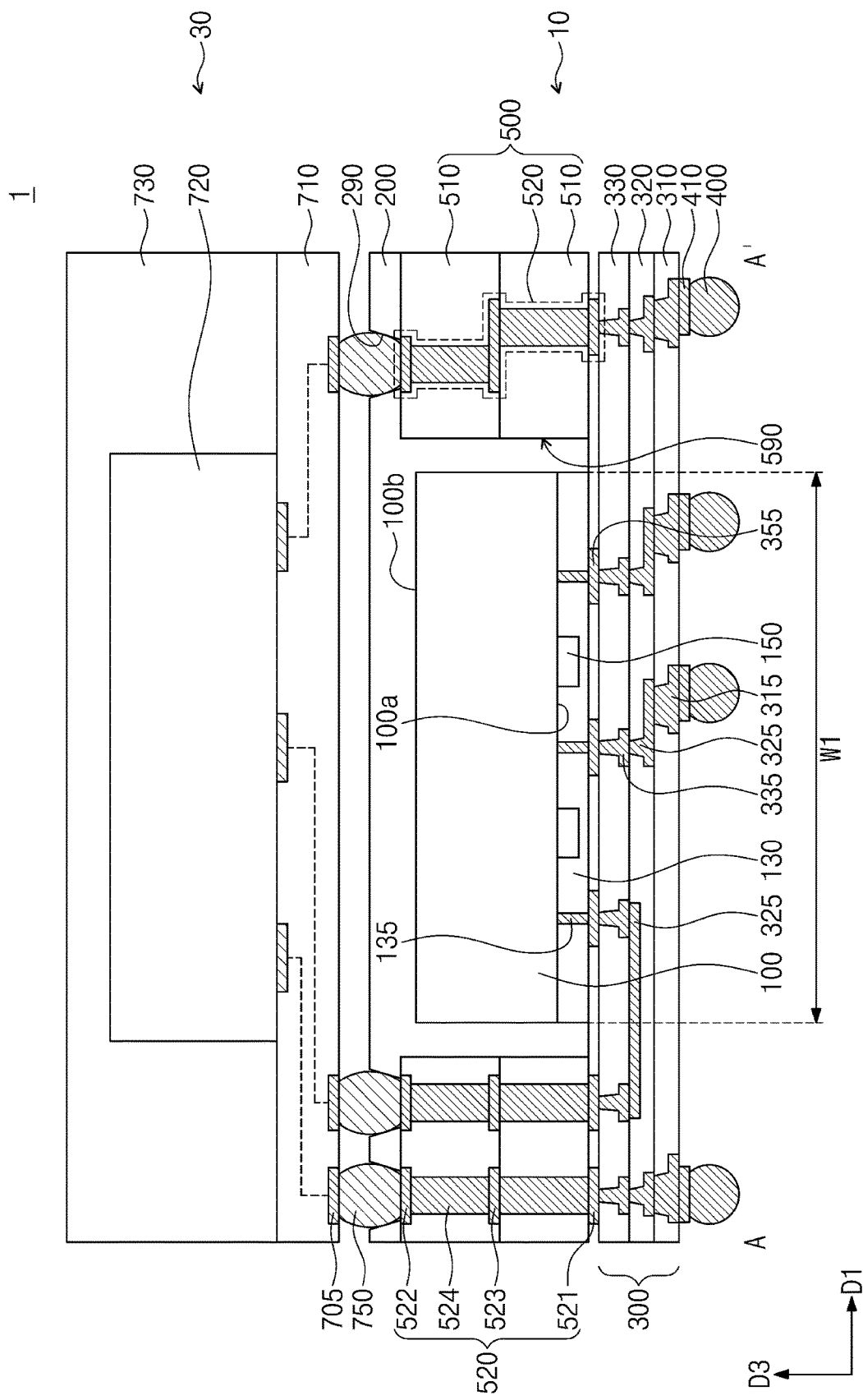

Referring to FIGS. 16 and 17, an upper hole 290 may be formed in an upper portion of the molding pattern 200. The upper hole 290 may expose the second pad 522. A connection terminal 750 may be formed on a top surface of the second pad 522. A second semiconductor package 30 may be disposed on a top surface of the connection terminal 750. The semiconductor package according to the embodiments of the inventive concepts may be manufactured by the manufacturing method described above.

According to the embodiments of the inventive concepts, the capacitor chip may be disposed adjacent to the semiconductor chip. A distance between the semiconductor chip and the capacitor chip may be reduced, and thus the sudden fluctuation of the power supply current may be reduced. As a result, a current may be stably supplied to the semiconductor chip, and thus the reliability of the semiconductor package may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
a redistribution layer;
a semiconductor chip provided on the redistribution layer and having a first surface and a second surface opposite to the first surface, the semiconductor chip including a first chip pad and a second chip pad which are exposed at the first surface;
a capacitor chip disposed between the first surface and the redistribution layer and extended across the first surface from a first sidewall of the semiconductor chip to a second sidewall of the semiconductor chip, the capacitor chip including
a through hole extending through the capacitor chip, and
a capacitor chip pad in direct physical contact with the first chip pad; and
a through structure extending through the through hole and being in direct physical contact with the second chip pad and connected to the redistribution layer.

2. The semiconductor package of claim 1, wherein the capacitor chip comprises a base substrate, a capacitor layer, and an interconnection layer.

3. The semiconductor package of claim 1, further comprising:
a molding pattern provided on the redistribution layer and covering the semiconductor chip,
wherein the redistribution layer extends onto a bottom surface of the molding pattern.

4. The semiconductor package of claim 3, further comprising:
an upper redistribution pattern on a top surface of the molding pattern.

5. The semiconductor package of claim 1, further comprising:
a connection substrate provided on the redistribution layer and having a hole penetrating the connection substrate,
wherein the semiconductor chip and the capacitor chip are provided in the hole.

6. The semiconductor package of claim 1, further comprising:
a molding pattern provided on the redistribution layer and encapsulating the semiconductor chip; and
a conductive structure penetrating the molding pattern and extending vertically,
wherein a sidewall of the conductive structure is substantially parallel to a sidewall of the molding pattern.

7. A semiconductor package comprising:
a redistribution layer;
a first semiconductor chip provided on the redistribution layer and having a first surface and a second surface opposite to the first surface, the first semiconductor chip including a first chip pad and a second chip pad which are exposed at the first surface;
a capacitor chip covering the first surface and disposed between the first surface and the redistribution layer, the capacitor chip including a capacitor chip pad in direct physical contact with the first chip pad; and
a through-structure penetrating the capacitor chip and being in direct physical contact with the second chip pad and connecting the second chip pad to the redistribution layer,
wherein a sidewall of the capacitor chip is vertically aligned with a sidewall of the first semiconductor chip.

8. The semiconductor package of claim 7, further comprising:
a liner layer covering an inner sidewall of a through-hole penetrating the capacitor chip,
wherein the through-structure is disposed in the through-hole, and
wherein the through-structure comprises a barrier pattern and a conductive pattern filling the through-hole.

9. The semiconductor package of claim 7,
wherein the capacitor chip comprises a base substrate including silicon, a capacitor layer, and an interconnection layer, and
wherein the interconnection layer exposes the capacitor chip pad.

10. The semiconductor package of claim 7, further comprising:
a molding pattern provided on the redistribution layer and covering the first semiconductor chip,
wherein the redistribution layer extends onto a bottom surface of the molding pattern.

11. The semiconductor package of claim 10, further comprising:
an upper redistribution pattern on a top surface of the molding pattern.

12. The semiconductor package of claim 11, further comprising:
a package substrate, a second semiconductor chip, and an upper molding pattern, which are provided on the upper redistribution pattern,
wherein the second semiconductor chip includes a memory chip.

13. The semiconductor package of claim 7, further comprising:
a connection substrate provided on the redistribution layer and having a hole penetrating the connection substrate,
wherein the first semiconductor chip and the capacitor chip are provided in the hole.

* * * * *